(12) United States Patent
Ishikura et al.

(10) Patent No.: US 9,236,268 B2
(45) Date of Patent: Jan. 12, 2016

(54) MANUFACTURING METHOD OF SEMICONDUCTOR DEVICE AND LITHOGRAPHY TEMPLATE

(71) Applicant: KABUSHIKI KAISHA TOSHIBA, Minato-ku, Tokyo (JP)

(72) Inventors: Taishi Ishikura, Yokkaichi (JP); Atsunobu Isobayashi, Yokkaichi (JP); Akihiro Kajita, Yokkaichi (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/172,641

(22) Filed: Feb. 4, 2014

(65) Prior Publication Data

US 2015/0111393 A1    Apr. 23, 2015

(30) Foreign Application Priority Data

Oct. 18, 2013 (JP) ................................ 2013-217488

(51) Int. Cl.
| | |
|---|---|
| *H01L 21/00* | (2006.01) |
| *H01L 21/308* | (2006.01) |
| *H01L 21/027* | (2006.01) |
| *H01L 21/3105* | (2006.01) |
| *G03F 7/00* | (2006.01) |

(52) U.S. Cl.
CPC .......... *H01L 21/3086* (2013.01); *G03F 7/0002* (2013.01); *H01L 21/0274* (2013.01); *H01L 21/3105* (2013.01)

(58) Field of Classification Search
CPC ................................................ H01L 31/022425
See application file for complete search history.

(56) References Cited

U.S. PATENT DOCUMENTS

| | | | |
|---|---|---|---|
| 8,476,170 B2 | 7/2013 | Ojima | |
| 2007/0161146 A1* | 7/2007 | Lee ................................. | 438/70 |
| 2013/0333203 A1* | 12/2013 | Kroener et al. ............... | 29/602.1 |

FOREIGN PATENT DOCUMENTS

JP    2013-179218 A    9/2013

* cited by examiner

*Primary Examiner* — Zandra Smith
*Assistant Examiner* — Andre'C Stevenson
(74) *Attorney, Agent, or Firm* — Holtz, Holtz, Goodman & Chick PC

(57) ABSTRACT

In the manufacturing method of a semiconductor device according to the present embodiment, a resist is supplied on a base material. A template including a first template region having a device pattern and a second template region being adjacent to the device pattern and having supporting column patterns is pressed against the resist on the base material. The resist is cured, thereby transferring the device pattern to the resist on a first material region of the base material corresponding to the first template region and at the same time transferring the supporting column patterns to the resist on a second material region of the base material corresponding to the second template region to form supporting columns. The supporting columns are contacted with the first template region when the device pattern is transferred to a resist supplied to the second material region.

11 Claims, 6 Drawing Sheets

MANUFACTURING METHOD OF SEMICONDUCTOR DEVICE AND LITHOGRAPHY TEMPLATE

CROSS REFERENCE TO RELATED APPLICATIONS

This application is based upon and claims the benefit of priority from the prior Japanese Patent Application No. 2013-217488, filed on Oct. 18, 2013, the entire contents of which are incorporated herein by reference.

FIELD

The embodiments of the present invention relate to a manufacturing method of semiconductor device and a lithography template.

BACKGROUND

Along with downscaling of semiconductor devices, nanoimprint lithography (hereinafter, also NIL) is developed as an alternative lithography technique to photolithography. In the NIL, a template having concave or convex patterns is pressed against a substrate on which a resist is applied or dripped and then the resist is cured. This transfers the patterns of the template to the resist on the substrate.

In the NIL, when the resist is removed from the template after the resist is cured, tensile stress and shear stress occurs between the template and the resist. At this time, the resist may be stripped from the substrate together with the template. To suppress such resist stripping, the resist is caused to remain between the convex patterns of the template and the substrate to adjust the thickness of a residual layer of the resist (hereinafter, also RLT (Residual Layer Thickness)) between the convex patterns of the template and the substrate. The RLT is generally adjusted according to a pressure at which the template is pressed against the substrate. However, because the resist before curing is liquid, the RLT is likely to vary if the RLT is controlled according to a pressure applied between the template and the substrate. If the RLT of the resist varies, the size, height, taper angle, and the like of the resist may also vary during processing of a base material. When the base material is processed using such a resist as a mask, the size, height, taper angle, and the like of the base material also disadvantageously vary.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

In the manufacturing method of a semiconductor device according to the present embodiment, a resist is supplied on a base material. A template including a first template region having a device pattern and a second template region being adjacent to the device pattern and having supporting column patterns is pressed against the resist on the base material. The resist is cured, thereby transferring the device pattern to the resist on a first material region of the base material corresponding to the first template region and at the same time transferring the supporting column patterns to the resist on a second material region of the base material corresponding to the second template region to form supporting columns. The supporting columns are contacted with the first template region when the device pattern is transferred to a resist supplied to the second material region.

First Embodiment

Figure 1:
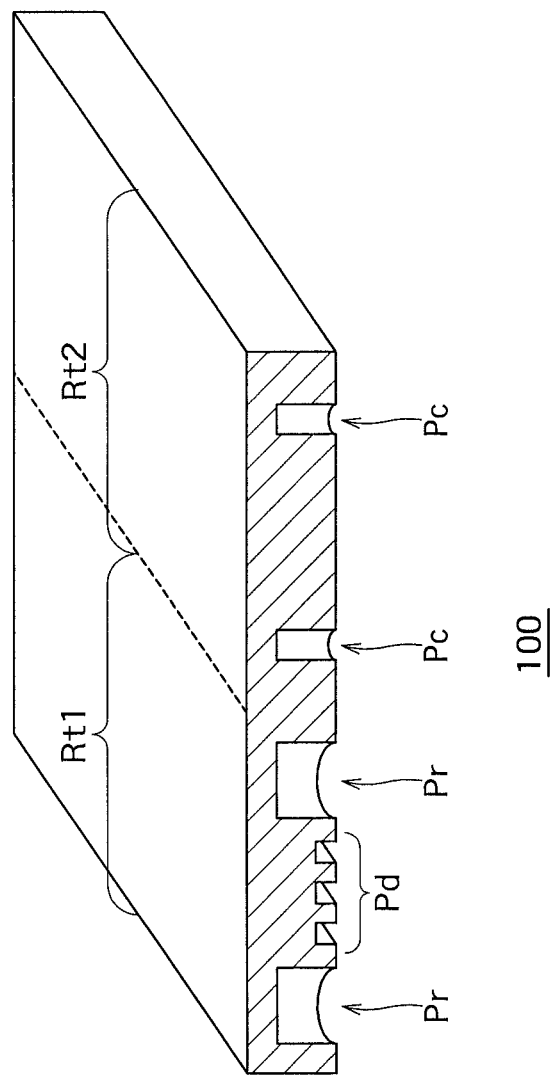
FIG. 1 is a perspective cross-sectional view showing an example of a configuration of a template 100 according to a first embodiment.

FIG. 1 is a perspective cross-sectional view showing an example of a configuration of a template 100 according to a first embodiment. The template 100 is a pattern substrate to be used in the nanoimprint lithography (NIL) technique and is formed using a material such as quartz or a resin. The template 100 has patterns including inverted concaves and convexes of layout patterns to be transferred to a base material (not shown in FIG. 1). The template 100 is pressed against a resist supplied (for example, applied or dripped) on the base material and then the resist is cured in this state, whereby the patterns of the template 100 are transferred to the resist on the base material. At this time, the concave portions of the template 100 are formed as convex portions on the base material while the convex portions of the template 100 are formed as concave portions on the base material.

The template 100 according to the first embodiment includes a first template region Rt1 and a second template region Rt2. The first template region Rt1 includes device patterns Pd and supporting-column receiving portions Pr. The device patterns Pd are desired layout patterns to be transferred onto the base material and include various device patterns for forming a semiconductor device. For example, the device patterns Pd can be patterns of one shot, such as a gate electrode pattern and a wiring pattern. One shot means one transfer process including resist supply, pressing of the template 100, resist curing, and separating of the template 100.

For example, when patterns of one shot include four chip patterns, the device patterns Pd of the four chips can be simultaneously formed by one shot.

When a certain shot is finished, the next shot is executed at a position adjacent to the patterns transferred by the finished shot. When shots are repeated in a certain row or column and the device patterns Pd are transferred up to an end of the row or column, shots are then executed in the next row or column. By repeating shots in this way, the device patterns Pd are transferred on the entire surface of the base material.

The supporting-column receiving portions Pr correspond to supporting columns formed on the base material and are provided to receive the supporting columns, respectively. The supporting columns are formed in the previous shot using the second template region Rt2 explained later. Functions of the supporting-column receiving portions Pr and the supporting columns are explained later in more detail.

The second template region Rt2 has supporting column patterns Pc for forming the supporting columns on the base material. The second template region Rt2 has no device pattern. The second template region Rt2 is adjacent to the first template region Rt1 and the first and second template regions Rt1 and Rt2 form one template 100 in an integrated manner.

In a certain shot, the template 100 transfers the device patterns Pd in the first template region Rt1 and the supporting column patterns Pc in the second template region Rt2 simultaneously onto the base material. The supporting columns formed by the supporting column patterns Pc at that time are received by the supporting-column receiving portions Pr in the first template region Rt1, respectively, in the next shot.

Depths of the supporting-column receiving portions Pr are formed to be almost equal to those of the supporting column patterns Pc. Accordingly, the supporting columns formed by the supporting column patterns Pc contact (abut on) upper surfaces of the supporting-column receiving portions Pr when received by the supporting-column receiving portions Pr, respectively. That is, when the first template region Rt1 is pressed against the resist on a base region where the supporting columns are formed, the supporting columns support the first template region Rt1. In this way, a distance between the template 100 and the base material can be determined and also the thicknesses (RLTs) of residual layers of the resist between the convex patterns of the template 100 and the base material can be determined, respectively. Widths of the supporting-column receiving portions Pr are formed larger than those of the supporting column patterns Pc. This enables the supporting columns formed by the supporting column patterns Pc to be easily received by the supporting-column receiving portions Pr, respectively.

FIGS. 2A to 3C are cross-sectional views showing a manufacturing method of a semiconductor device according to the first embodiment. FIGS. 4A to 4C are perspective views showing the manufacturing method of a semiconductor device according to the first embodiment. Although not particularly limited thereto, a base material 10 can be, for example, a conducting material or an insulating material formed on a semiconductor substrate.

(Shot 0)

Figure 2A:
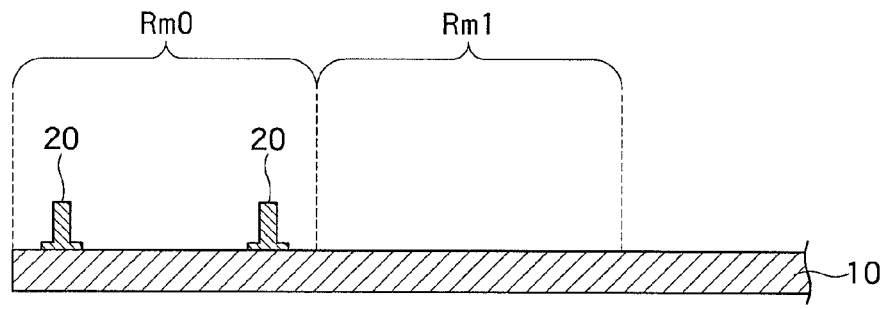
FIGS. 2A to 3C are cross-sectional views showing a manufacturing method of a semiconductor device according to the first embodiment.

As shown in FIGS. 2A and 4A, supporting columns 20 are formed on the base material 10 in an initial shot. At this time, the second template region Rt2 of the template 100 is used while the first template region Rt1 is not used. For example, a liquid resist is dripped on formation parts of the supporting columns 20 in a material region Rm0 and then the second template region Rt2 is pressed against the material region Rm0. In this state, the resist is cured by exposure. The template 100 is then removed from the base material 10, whereby the supporting columns 20 are formed on the material region Rm0. The supporting columns 20 formed in the shot 0 are determined according to a pressure applied between the template 100 and the base material 10.

(Shot 1)

Figure 2B:
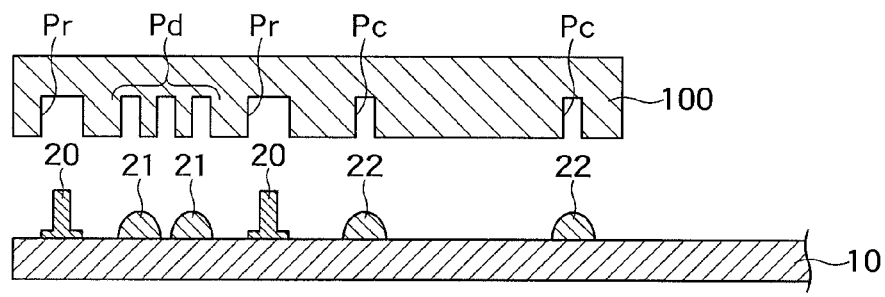

As shown in FIG. 2B, a resist 21 is then dripped on formation regions of the device patterns Pd in the material region Rm0 and a resist 22 is dripped on formation regions of the supporting columns 20 in a material region Rm1. The material region Rm1 is a surface region of the base material 10 adjacent to the material region Rm0.

Figure 2C:
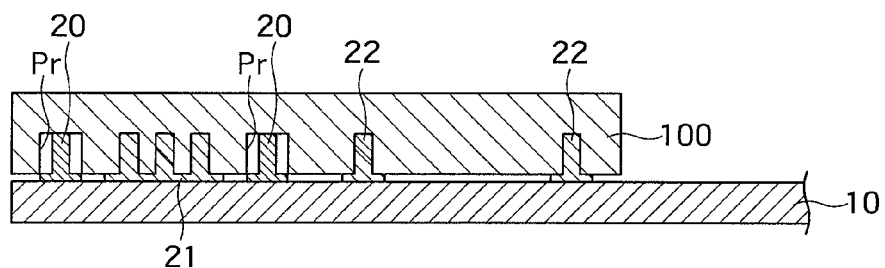

As shown in FIG. 2C, the template 100 is then pressed against the resists 21 and 22 on the base material 10. At this time, the first template region Rt1 is positioned to correspond to the material region Rm0 and the second template region Rt2 is positioned to correspond to the material region Rm1. That is, a part of a region for the shot 1 (the first template region Rt1) is overlapped with a region for the shot 0 (the material region Rm0). When the first template region Rt1 is pressed against the material region Rm0, the supporting columns 20 on the base material 10 are received by the supporting-column receiving portions Pr of the template 100, respectively. As mentioned above, the widths of the supporting-column receiving portions Pr are formed larger than those of the supporting column patterns Pc, the supporting columns 20 are relatively easily received by the supporting-column receiving portions Pr, respectively, even when there is a slight misalignment.

Because the depths of the supporting column patterns Pc are almost equal to those of the supporting-column receiving portions Pr, heights of the supporting columns 20 are almost equal to or larger than the depths of the supporting-column receiving portions Pr. Therefore, the supporting columns 20 contact the upper surfaces of inner walls of the supporting-column receiving portions Pr, respectively. Because the supporting columns 20 are cured, the template 100 does not approach the base material 10 any more and a distance between the template 100 and the base material 10 is maintained when the supporting columns 20 contact the upper surfaces of the supporting-column receiving portions Pr. When the device patterns Pd are transferred to the resist 21 in the material region Rm0 in this way, the supporting columns 20 in the material region Rm0 are contacted with the supporting-column receiving portions Pr in the first template region Rt1, respectively. This forms RLTs of the resist 21 in the device patterns Pd to be almost uniform without varying in the resist 21. The fact that the RLTs of the resist 21 are almost uniform indicates that heights H of convex portions in the resist 21 are also almost uniform without varying.

In the material region Rm1, as shown in FIG. 2C, the second template region Rt2 is pressed against the resist 22 on the material region Rm1 at the same time as the first template region Rt1 is pressed against the resist 21 on the material region Rm0.

Figure 2D:
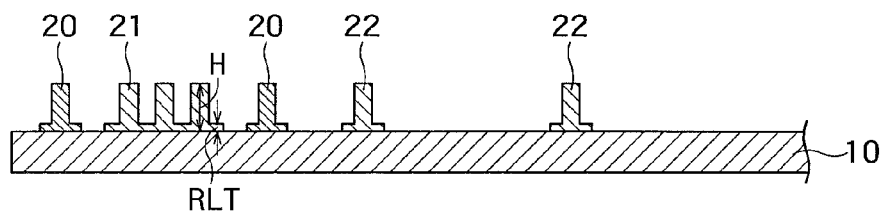

The resists 21 and 22 are cured by exposure in this state. The template 100 is then separated from the base material 10, whereby the device patterns Pd are transferred to the resist 21 on the material region Rm0 corresponding to the first template region Rt1 as shown in FIGS. 2D and 4B. At the same time, the supporting column patterns Pc are transferred to the resist 22 on the material region Rm1 corresponding to the second template region Rt2. In the following descriptions, the resist 22 is referred to as "supporting columns 22".

(Shot 2)

Figure 3A:
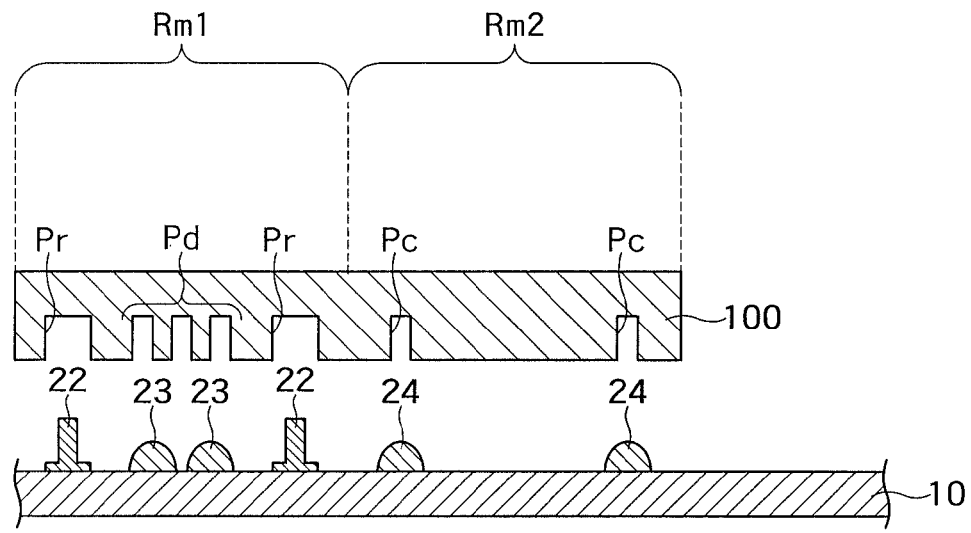
Figure 4A:
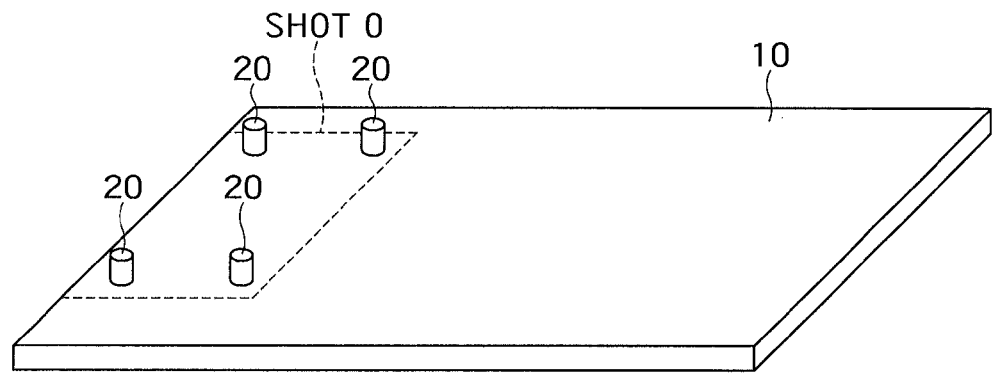
FIGS. 4A to 4C are perspective views showing the manufacturing method of a semiconductor device according to the first embodiment.
Figure 4B:
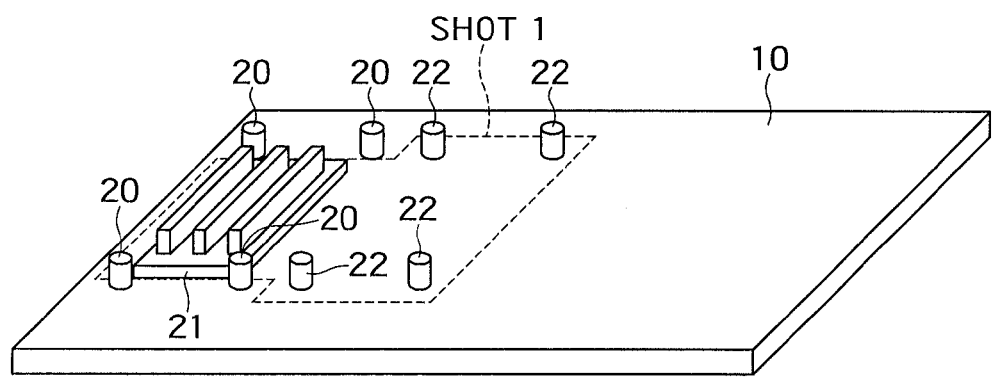
Figure 4C:
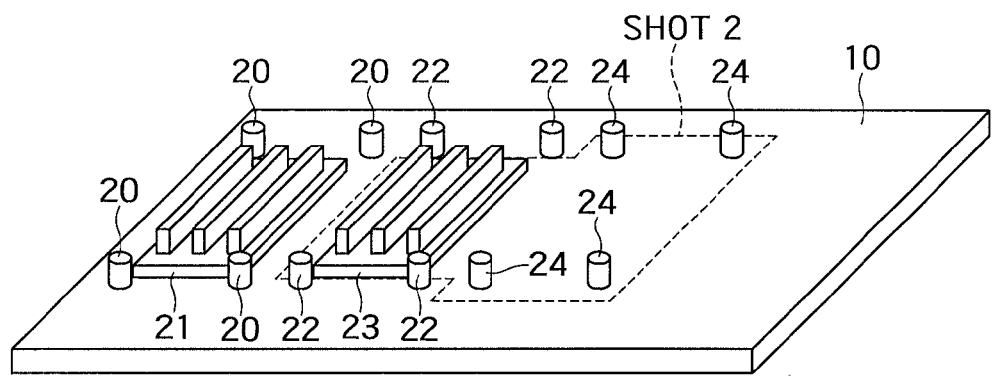

Next, as shown in FIG. 3A, a resist 23 is dripped on formation regions of the device patterns Pd in the material region Rm1 and a resist 24 is dripped on formation regions of the supporting columns 20 in a material region Rm2. The material region Rm2 is a surface region of the base material 10 adjacent to the material region Rm1.

Figure 3B:
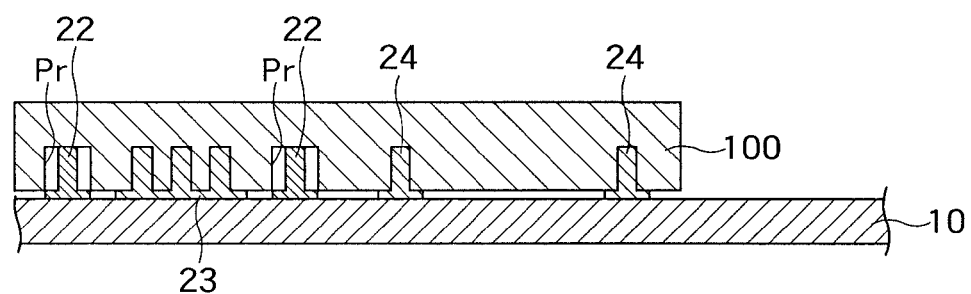

As shown in FIG. 3B, the template 100 is then pressed against the resists 23 and 24 on the base material 10. At this time, the first template region Rt1 is positioned to correspond to the material region Rm1 and the second template region Rt2 is positioned to correspond to the material region Rm2. That is, a part of a region for the shot 2 (the first template region Rt1) is overlapped with a part of the region for the shot 1 (the material region Rm1). When the first template region Rt1 is pressed against the material region Rm1, the supporting columns 22 on the base material 10 are received by the supporting-column receiving portions Pr of the template 100, respectively.

At this time, the supporting columns 20 are relatively easily received by the supporting-column receiving portions Pr, respectively, as described with respect to the shot 1. The supporting columns 20 contact the upper surfaces of the inner walls of the supporting-column receiving portions Pr, respectively, and a distance between the template 100 and the base material 10 is maintained. Therefore, RLTs of the resist 23 in the device patterns Pd are almost uniform in the resist 23 and heights H of the convex portions in the resist 23 are also almost uniform in the resist 23.

In the material region Rm2, as shown in FIG. 3B, at the same time as the first template region Rt1 is pressed against the resist 23 on the material region Rm1, the second template region Rt2 is pressed against the resist 24 on the material region Rm2.

Figure 3C:
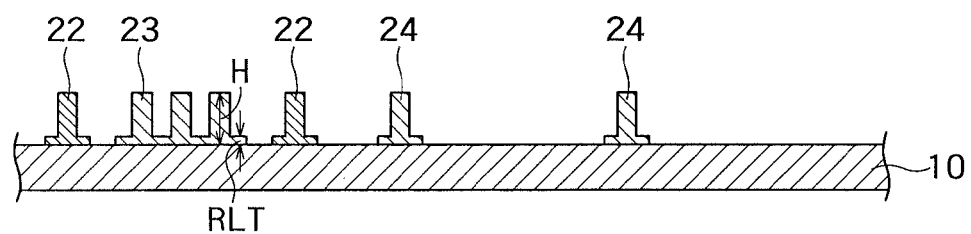

The resists 23 and 24 are cured in this state by exposure. The template 100 is then separated from the base material 10, whereby the device patterns Pd are transferred to the resist 23 on the material region Rm1 corresponding to the first template region Rt1 as shown in FIGS. 3C and 4C. At the same time, the supporting column patterns Pc are transferred to the resist 24 on the material region Rm2 corresponding to the second template region Rt2. In the following descriptions, the resist 24 is hereinafter referred to as "supporting columns 24".

(Shot k)

When the shots 1 and 2 are repeated, the device patterns Pd and the supporting column patterns Pc can be transferred simultaneously to material regions Rm(k−1) and Rmk (k is an integer equal to or larger than 1) adjacent to each other, respectively. Because processes in a shot k can be easily presumed by referring to FIGS. 2B to 3C, illustrations thereof will be omitted.

In the shot k, a resist is dripped on formation regions of the device patterns Pd in the material region Rm(k−1) and a resist is dripped on formation regions of supporting columns in the material region Rmk.

The material region Rmk is a surface region of the base material 10 adjacent to the material region Rm(k−1).

The template 100 is then pressed against the resist on the base material 10. At this time, the first template region Rt1 is positioned to correspond to the material region Rm(k−1) and the second template region Rt2 is positioned to correspond to the material region Rmk. That is, a part of a region for the shot k (the first template region Rt1) is overlapped with a part of a region for a shot (k−1) (the material region Rm(k−1)). When the first template region Rt1 is pressed against the material region Rm(k−1), supporting columns on the material region Rm(k−1) are received by the supporting-column receiving portions Pr of the template 100, respectively.

In the material region Rmk, at the same time as the first template region Rt1 is pressed against the resist on the material region Rm(k−1), the second template region Rt2 is pressed against the resist on the material region Rmk.

In this state, the resists on the base material 10 are cured by exposure. The template 100 is then separated from the base material 10, whereby the device patterns Pd are transferred to the resist on the material region Rm(k−1) corresponding to the first template region Rt1.

At the same time, the supporting column patterns Pc are transferred to the resist on the material region Rmk corresponding to the second template region Rt2.

As described above, in the NIL using the template 100 according to the first embodiment, when the device patterns Pd are transferred to a resist on the base material, the supporting columns 20, 22, 24 and onwards determine a distance between the template 100 and the base material 10. That is, the RLTs can be controlled by the heights of the supporting columns 20, 22, 24 and onwards. Accordingly, the RLTs can be formed almost uniform (about 15 nanometers, for example) in each shot.

In a case where there is no supporting column, the RLTs need to be controlled according to a pressure applied between a template and a base material when the template is pressed against the base material. In this case, the RLTs vary both in each shot and among plural shots. For example, when a design value of the RLTs is 15 nanometers, the RLTs vary between 5 nanometers and 20 nanometers and the heights of the convex portions in the resist vary between 65 nanometers and 80 nanometers. Such variations in the RLTs or variations in the heights of the convex portions in the resist lead to variations in the size, height, taper angle, and the like of the base material as mentioned above. Furthermore, viscosity and elasticity increases when the RLTs of the resist are equal to or lower than a threshold (about 5 to 10 nanometers). Therefore, if the resist has a portion with an RLT value equal to or lower than the threshold, shear stress occurring between the template and the base material increases when the template is displaced during an alignment. If the shear stress is increased, the resist may be stripped from the base material due to the shear stress and tensile stress (separation force) when the template is separated from the base material. For example, if the resist has a portion with an RLT equal to or lower than 5 nanometers, the shear stress occurring between the template and the base material is increased more and a problem that the resist is stripped from the base material due to the shear stress and the tensile stress (separation force) during separation of the template from the base material becomes more significant.

On the other hand, in the first embodiment, by providing the supporting columns 20, 22, 24 and onwards, the RLTs can be formed almost uniform in each shot as mentioned above. Furthermore, for example, the supporting columns 22 are formed using the second template region Rt2 in the same template 100 as that of the first template region Rt1 and are formed in the material region Rm1 at the same time as transfer of the device patterns Pd to the material region Rm0. Therefore, the supporting columns 22 are formed in a region adjacent to transfer regions of the device patterns Pd when the supporting columns 20 define the RLTs. Accordingly, the supporting columns 22 can be formed at almost same heights as those of the supporting columns 20. The fact that the heights of the supporting columns 20 and 22 are almost equal indicates that the RLTs are almost uniform among plural shots.

Therefore, according to the first embodiment, not only the RLTs can be formed almost uniform in each shot but also the RLTs can be formed almost uniform (about 15 nanometer, for example) among plural shots. As a result, when the base material is processed using the resist formed according to the first embodiment as a mask, the size, height, taper angle, and the like of the base material stabilize.

Furthermore, by forming the RLTs almost uniform, local reduction of the RLTs in the resist can be suppressed. The RLTs can be thereby stabilized to a design value (about 15 nanometers, for example) and thus the shear stress occurring between the template 100 and the base material 10 when the template 100 is displaced during an alignment can be reduced. As a result, resist stripping due to the separation force can be suppressed.

Further, according to the first embodiment, while the supporting column patterns Pc are transferred in each shot, the device patterns Pd can be transferred at the same time. That is, transfer of the device patterns Pd can be executed without being interrupted by formation of the supporting columns. Therefore, in the NIL method using the template 100 according to the first embodiment, the time of the lithography process is not prolonged.

Further, according to the first embodiment, because the supporting-column receiving portions Pr are recessed, positioning of the template 100 can be easily performed when the supporting-column receiving portions Pr receive the supporting columns 20 on the base material 10, respectively. However, the positioning using the supporting-column receiving portions Pr and the supporting columns 20 is rough positioning and thus strict positioning is performed using an alignment pattern.

Second Embodiment

Figure 5:
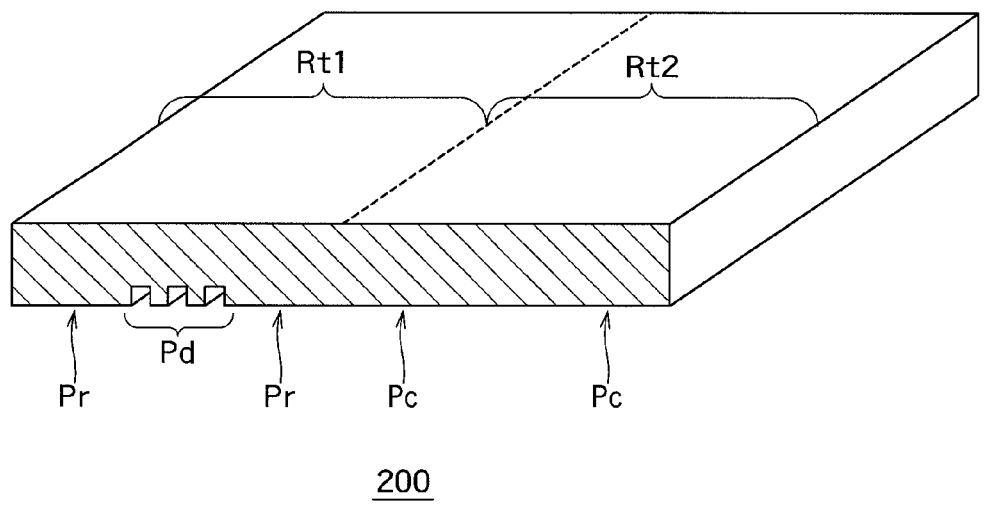
FIG. 5 is perspective cross-sectional view showing an example of a configuration of a template 200 according to a second embodiment.

FIG. 5 is perspective cross-sectional view showing an example of a configuration of a template 200 according to a second embodiment. The template 200 according to the second embodiment does not have recessed portions in the supporting column patterns Pc and in the supporting-column receiving portions Pr. Other configurations of the template 200 can be identical to corresponding configurations of the template 100 according to the first embodiment.

Figure 6A:
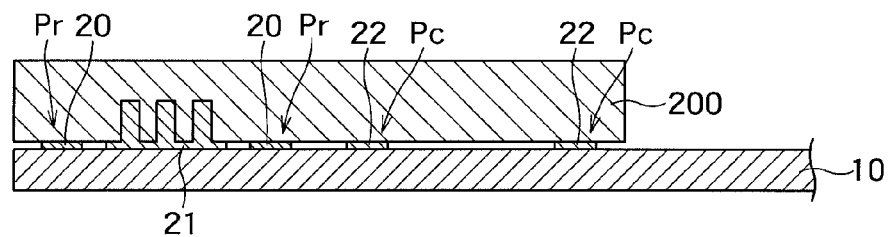
FIGS. 6A and 6B are cross-sectional views showing a certain shot using the template 200 according to the second embodiment.
Figure 6B:
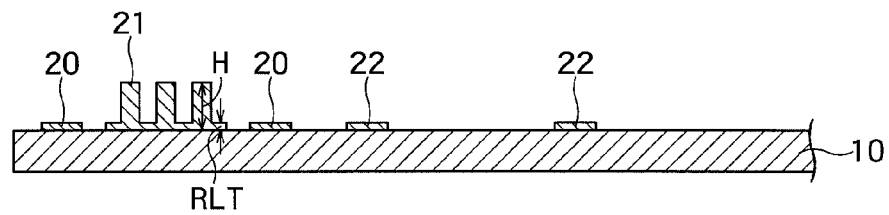

Even if both of the supporting column patterns Pc and the supporting-column receiving portions Pr are flat, supporting columns can be formed when depths or height of the supporting column patterns Pc and the supporting-column receiving portions Pr are equal. For example, FIGS. 6A and 6B are cross-sectional views showing a certain shot using the template 200 according to the second embodiment. A case of the shot 1 corresponding to FIGS. 2C and 2D is explained below.

In the shot 1, as shown in FIG. 6A, the template 200 is pressed against the resists 21 and 22 on the base material 10. At this time, the first template region Rt1 is positioned to correspond to the material region Rm0 and the second template region Rt2 is positioned to correspond to the material region Rm1. When the first template region Rt1 is pressed against the material region Rm0, the supporting columns 20 on the base material 10 contact the supporting-column receiving portions Pr of the template 200.

Because the supporting column patterns Pc are at almost equal depth or height levels to those of the supporting-column receiving portions Pr, heights of the supporting columns 20 are formed equal to or larger than those of the supporting-column receiving portions Pr. Therefore, the supporting columns 20 contact the supporting-column receiving portions Pr, respectively. When the supporting columns 20 contact the supporting-column receiving portions Pr, respectively, the template 200 does not approach the base material 10 any more and a distance between the template 200 and the base material 10 is maintained because the supporting columns 20 are cured. In this way, when the device patterns Pd are transferred to the resist 21 on the material region Rm0, the supporting columns 20 in the material region Rm0 are caused to contact the supporting-column receiving portions Pr, respectively.

In the material region Rm1, the second template region Rt2 is pressed against the resist 22 on the material region Rm1 at the same time as the first template region Rt1 is pressed against the resist 21 on the material region Rm0.

In this state, the resists 21 and 22 are cured by exposure. The template 200 is then separated from the base material 10, whereby the device patterns Pd are transferred to the resist 21 on the material region Rm0 corresponding to the first template region Rt1 as shown in FIG. 6B. At the same time, the supporting column patterns Pc are formed on the resist 22 on the material region Rm1 corresponding to the second template region Rt2.

In the second embodiment, because the supporting column patterns Pc and the supporting-column receiving portions Pr are almost flat to a surface of the template 200, the supporting columns 20 and 22 have heights (thicknesses) almost equal to RLTs.

However, the supporting columns 20 and 22 in the second embodiment can have functions identical to those of the first embodiment. Therefore, the second embodiment can achieve effects identical to those of the first embodiment.

Furthermore, because the supporting column patterns Pc and the supporting-column receiving portions Pr are almost flat to the surface of the template 200, it is unnecessary to note widths of the supporting column patterns Pc and of the supporting-column receiving portions Pr so much. Therefore, a risk that the supporting columns 20 or 22 are displaced from the supporting-column receiving portions Pr due to a misalignment is reduced.

Further, the template 200 can be easily formed because the supporting column patterns Pc and the supporting-column receiving portions Pr are almost flat to the surface of the template 200 in the second embodiment.

Further, the supporting column patterns Pc and the supporting-column receiving portions Pr can have convex shapes with respect to the surface of the template 200. In this case, it suffices that the heights of the supporting column patterns Pc and the heights of the supporting-column receiving portions Pr are almost equal.

Third Embodiment

Figure 7:
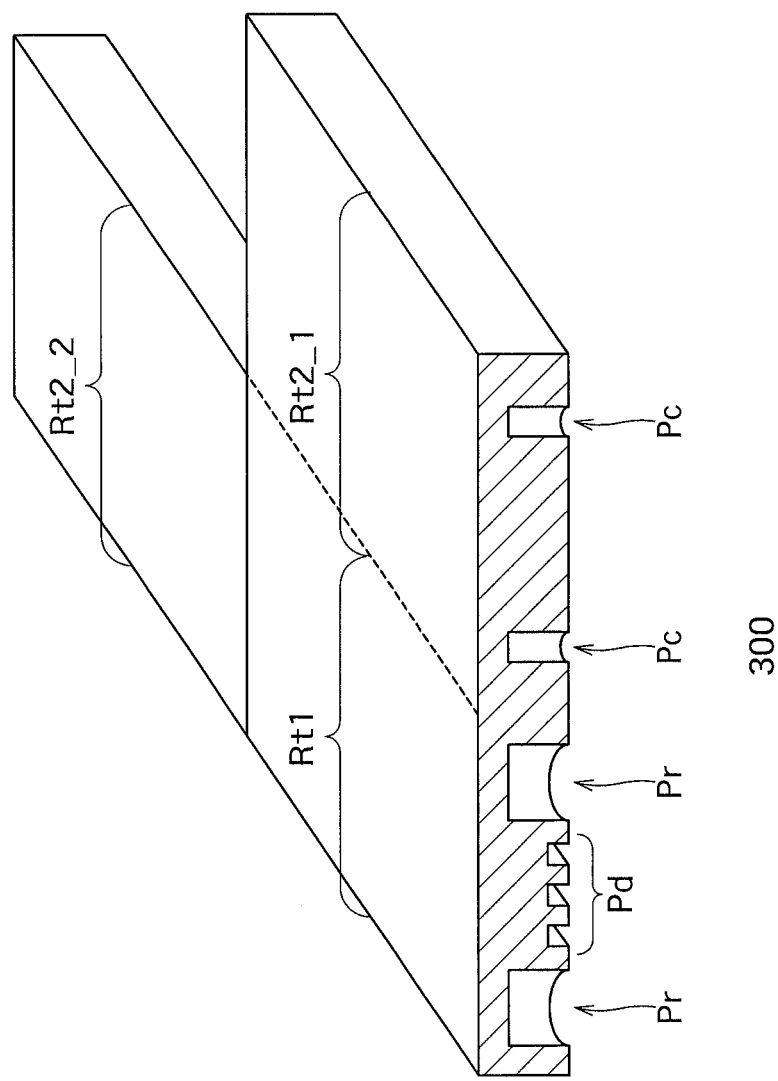
FIG. 7 is a perspective cross-sectional view showing an example of a configuration of a template 300 according to a third embodiment.

FIG. 7 is a perspective cross-sectional view showing an example of a configuration of a template 300 according to a third embodiment. The template 300 according to the third embodiment has a plurality of second template regions Rt2_1 and Rt2_2. The second template regions Rt2_1 and Rt2_2 are adjacent to the first template region Rt1 in directions substantially orthogonal to each other. That is, the second template region Rt2_2 is adjacent to the first template region Rt1 in a direction substantially orthogonal to a direction in which the second template region Rt2_1 is adjacent to the first template region Rt1. Each of the second template regions Rt2_1 and Rt2_2 has the supporting column patterns Pc. Other configurations of the template 300 can be identical to corresponding configurations of the template 100 according to the first embodiment.

The second template region Rt2_1 has a function identical to that of the second template region Rt2 in the first embodiment. That is, the second template region Rt2_1 is used to form supporting columns in a region adjacent to transfer regions of the device patterns Pd in a certain shot (k−1). The formed supporting columns function as supporting columns of the template 300 during transfer of the device patterns Pd in the next shot k.

Meanwhile, the second template region Rt2_2 is provided to be used during transfer of the device patterns Pd in a certain row or column to form supporting columns for the next row or column. In this example, a row or column indicates a row or column of a plurality of shots to be consecutively executed.

For example, the first and second template regions Rt1 and Rt2_1 transfer the device patterns Pd and the supporting column patterns Pc, respectively, in each of consecutive shots included in a row. For example, in the shot 1, the device patterns Pd are transferred with supporting columns contacting the first template region Rt1 while at the same time supporting columns are formed using the second template region Rt2_1. In the third embodiment, the second template region Rt2_2 forms supporting columns for shots included in the next row (a row adjacent to a row in which transfer of the device patterns Pd is executed at that time). That is, transfer regions of the supporting column patterns Pc of the second template region Rt2_2 are located at positions substantially orthogonal to transfer regions of the supporting column patterns Pc of the second template region Rt2_1 with respect to the device patterns Pd. The supporting columns can be formed only in a region corresponding to first one of the shots included in the next row or can be formed in regions corresponding to plural shots, respectively.

According to the third embodiment, the heights or RLTs of the supporting columns can be formed almost uniform not only in a single row or column but also in plural adjacent rows or columns. In this way, the heights or RLTs of the supporting columns can be formed almost uniform on the entire surface of the base material 10.

The supporting-column receiving portions Pr and the supporting column patterns Pc of the template 300 according to the third embodiment can have modes identical to those of the second embodiment.

Modification

Planar shapes (planar patterns) of the supporting column patterns Pc and the supporting-column receiving portions Pr and the numbers thereof in the templates 100 to 300 are not particularly limited as long as the supporting column patterns Pc and the supporting-column receiving portions Pr do not overlap with the device patterns Pd and can support the templates 100 to 300. For example, the supporting column patterns Pc and the supporting-column receiving portions Pr can be circles or can be polygons such as quadrangles. Furthermore, the supporting column patterns Pc and the supporting-column receiving portions Pr can be linear or can be formed like a frame to surround the device patterns Pd.

As for the numbers of the supporting column patterns Pc and the supporting-column receiving portions Pr, one supporting column pattern Pc and one supporting-column receiving portion Pr can be provided at each corner of the first and second template regions Rt1 and Rt2, respectively, for example. While the numbers of the supporting column patterns Pc and the supporting-column receiving portions Pr are four, respectively, in this case, the numbers thereof can be more than four. As long as the templates 100 to 300 can be sufficiently supported, the numbers of the supporting column patterns Pc and the supporting-column receiving portions Pr can be equal to or less than three, respectively. For example, the supporting column patterns Pc can be one pattern with a large area. In this case, the templates 100 to 300 are supported by a surface of one supporting column.

As described above, effects of the above embodiments can be achieved even when the shapes of the supporting column patterns Pc and the supporting-column receiving portions Pr (that is, shapes of the supporting columns) are modified.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device, the method comprising:
   supplying a first resist on a first material region and a second material region of a base material;
   pressing a template including a first template region having a device pattern and a second template region being adjacent to the device pattern and having supporting column patterns against the first resist on the base material, such that the first template region corresponds to the first material region, and such that the second template region corresponds to the second material region;
   curing the first resist, thereby transferring the device pattern to the first resist on the first material region and at the same time transferring the supporting column patterns to the first resist on the second material region to form supporting columns;
   supplying a second resist on the second material region and a third material region of the base material; and
   pressing the template against the second resist, such that the first template region corresponds to the second material region, and such that the second template region corresponds to the third material region,
   wherein the supporting columns transferred to the second material region contact with the first template region when the device pattern is transferred to the second resist on the second material region.

2. The method of claim 1, wherein when the device pattern is transferred to the second resist on the second material region of the base material, the supporting column patterns are transferred to the second resist on the third material region of the base material corresponding to the second template region to form supporting columns.

3. The method of claim 1, wherein when the device pattern is transferred to a k−1th resist on a k−1th (k is an integer) material region of the base material, supporting columns on the k−1th material region are contacted with the first template region and the supporting column patterns are transferred to the k−1th resist on a kth material region of the base material corresponding to the second template region to form supporting columns.

4. The method of claim 2, wherein when the device pattern is transferred to a k−1th resist on a k−1th (k is an integer) material region of the base material, supporting columns on the k−1th material region are contacted with the first template region and the supporting column patterns are transferred to the k−1th resist on a kth material region of the base material corresponding to the second template region to form supporting columns.

5. The method of claim 1, further comprising:
   when the device pattern is transferred to the second resist on the second material region:
   pressing the first template region against the second resist on the second material region to contact the first template region with the supporting columns on the second material region; and curing the second resist, thereby transferring the device pattern to the second resist on the second material region.

6. The method of claim 1, wherein when the device pattern is transferred to the second resist on the second material region, the supporting columns on the second material region determine a distance between the first template region and the second material region.

7. The method of claim 2, wherein when the device pattern is transferred to the second resist on the second material region, the supporting columns on the second material region determine a distance between the first template region and the second material region.

8. The method of claim 3, wherein when the device pattern is transferred to the second resist on the second material region, the supporting columns on the second material region determine a distance between the first template region and the second material region.

9. The method of claim 1, wherein a thickness of a residual layer of the second resist in the device pattern transferred onto the base material is controlled according to heights of the supporting columns on the base material.

10. The method of claim 1, wherein:
the template includes a plurality of the second template regions adjacent to the first template region in directions substantially orthogonal to each other, and
the supporting column patterns are transferred to resists on a plurality of second material regions of the base material corresponding to respective ones of the plurality of second template regions, to form supporting columns during transfer of the supporting column patterns.

11. The method of claim 10, wherein the second material regions are adjacent to the first material region in directions substantially orthogonal to each other.

* * * * *